United States Patent [19]

Bacon et al.

[11] Patent Number: 4,466,864
[45] Date of Patent: Aug. 21, 1984

[54] METHODS OF AND APPARATUS FOR ELECTROPLATING PRESELECTED SURFACE REGIONS OF ELECTRICAL ARTICLES

[75] Inventors: Duane E. Bacon, Lee's Summit; Spencer S. Hecox, Raytown, both of Mo.

[73] Assignee: AT&T Technologies, Inc., New York, N.Y.

[21] Appl. No.: 561,862

[22] Filed: Dec. 16, 1983

[51] Int. Cl.³ .......................... C25D 5/02; C25D 7/12; C25D 17/00

[52] U.S. Cl. ...................................... 204/15; 204/231; 204/DIG. 7; 204/DIG. 9

[58] Field of Search .................. 204/15, 231, DIG. 7, 204/DIG. 9

[56] References Cited

U.S. PATENT DOCUMENTS

| | | | |
|---|---|---|---|
| 2,678,909 | 5/1954 | Jernstedt | 204/DIG. 9 |
| 2,893,929 | 7/1959 | Schnable | 204/15 |
| 3,880,725 | 4/1975 | Van Raalte | 204/15 |
| 4,396,467 | 8/1983 | Anthony | 204/15 |

FOREIGN PATENT DOCUMENTS

| | | | |
|---|---|---|---|
| 53-37542 | 6/1978 | Japan | 204/15 |
| 53-37543 | 6/1978 | Japan | 204/15 |

Primary Examiner—Thomas Tufariello
Attorney, Agent, or Firm—W. O. Schellin

[57] ABSTRACT

An article, such as a semiconductor wafer (31), is selectively electrolytically plated to form metal deposits, such as contacts (26), adjacent to anodes of diode regions within such wafer by mounting the wafer in a plating chamber (36) opposite first and second electrodes (61 and 62), filling the chamber (36) with a metal plating electrolyte (49) and applying alternatingly plating pulses between the wafer (31) and the first electrode (61) and deplating pulses between the wafer (31) and the second electrode (62). The plating pulses are current controlled yielding a predetermined total plating current. The deplating pulses are voltage controlled yielding a deplating current which tends to subside in the course of the plating operation. The electrolyte in the chamber is agitated by streams of electrolyte pumped at a comparatively high rate toward the wafer (31) to break down surface layers of electrolyte adjacent to the wafer.

16 Claims, 6 Drawing Figures

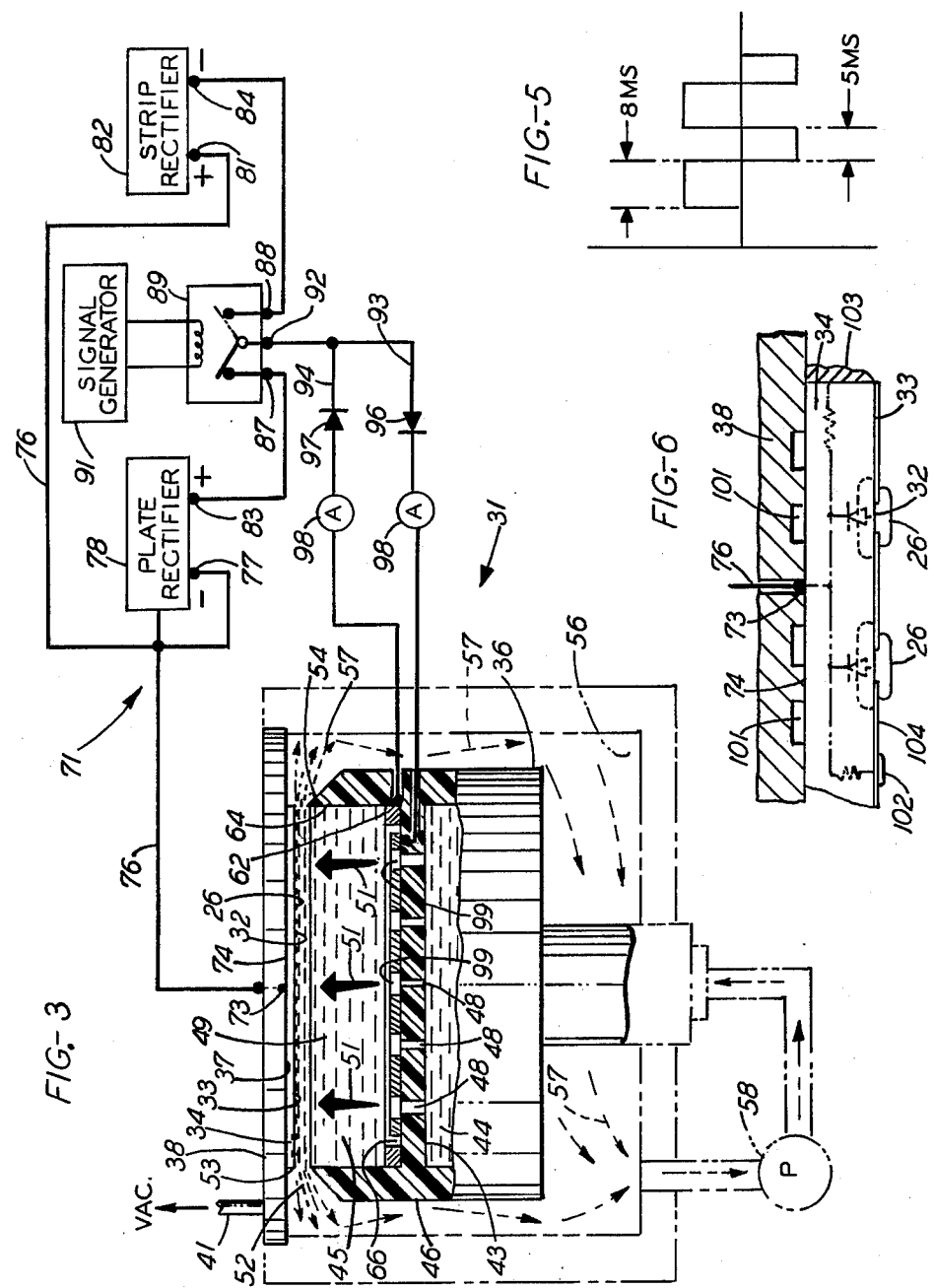

METHODS OF AND APPARATUS FOR ELECTROPLATING PRESELECTED SURFACE REGIONS OF ELECTRICAL ARTICLES

TECHNICAL FIELD

The present invention relates to methods of and apparatus for electroplating selected surface regions of electrical devices. The invention relates particularly to electroplating conductive patterns in surface regions which are coupled to anodes of diodes in otherwise masked semiconductor wafers.

BACKGROUND OF THE INVENTION

According to typical semiconductor device manufacturing techniques, semiconductor devices are formed in arrays as a plurality of integral regions of comparatively large semiconductor wafers. After the devices have been formed by a sequence of selective processing steps the wafers are separated along predetermined parting lines into the individual devices which are also referred to as chips.

A well known, rather basic electrical device is a diode. A well-known method of forming diodes from semiconductor wafers is to start with wafers of n-type semiconductor material. One of the major surfaces of each wafer becomes its back side which typically carries a metal deposit of uniform thickness. After separation of the wafer into individual devices, the metal deposit forms the back contact on the respective devices. The front side of each wafer is passivated such as by a formed oxide layer. By a series of typical selective treatment steps a plurality of separate p-type regions are formed in the wafer adjacent to the front side of the wafer. Each junction of the p-type region with the n-type wafer forms a separate diode. A window is then opened above each p-type region, the surface is metallized with a conductive film, and a metal contact, typically of silver, is electroplated in the window to a thickness that the contact extends at least to some height above the adjacent passivating layer on the surface of the wafer. After the contacts have been formed, the devices are complete, and the wafer is then separated into the individual diode chips.

In packaging the diode chips into typical axially-leaded diode circuit components, each of the chips is sandwiched between two flat ends of outwardly extending lead studs. The sandwiched assemblage is retained by a glass sleeve which becomes heat sealed about the two studs to retain the assemblage as a permanently assembled diode circuit component.

Problems with making diodes in the above-described manner are related to electroplating the contacts on the front side of the wafers. In general, the p-type regions adjacent to which the contacts are formed lend themselves to electroplating in that the plating current passes through the formed diode regions in the non-blocking direction. However, metal deposits are also formed at defect points in the passivating layer of the wafer outside of the p-type regions and particularly at the unprotected edges of the wafers. Since the applied plating current does not have to pass through the diode junction in its electrolytic path through any defects and consequently does not see the typical drop in voltage in the forward direction of the diode, metal deposits more quickly at the unwanted defect contact areas than at the actual contact areas.

Known plating techniques consequently use alternating plating currents whereby the wafer is subjected to a sequence of cycles of alternatingly plating currents and deplating currents. Consequently, all exposed areas in the first part of the cycle tend to become plated. However, in the second part of the cycle only the plated defects become deplated, since the deplating current is blocked by the diodes from passing through the desired diode contacts. Thus, a mechanism exists for minimizing the plating of shorting defects.

However, a problem of plating diode contacts at an economical rate and to an acceptable thickness is not overcome by such alternating current electroplating method. Problems in controlling the plating rate of alternating current plating methods have continued to exist. The reverse plating current tends to alter the plating conditions to prevent the diode contacts from being formed consistently to a predetermined contact height even though a given set of plating parameters has apparently not changed. Invariably occurring deviations from a desired plating cycle result in defective product, in loss of yield and in raised costs because of such losses and because of added downtime to restore the plating process to yield desired results.

SUMMARY OF THE INVENTION

Advantages are derived and difficulties with prior art plating operations are avoided by novel methods of and apparatus for electrolytically depositing contact material in preselected anode regions of diode-coupled surface regions of an electrical article. In accordance with the present invention, a method of electrolytically plating metal patterns to patterned anode surface windows of diode-coupled conductive regions beneath a passivating surface layer of an electric article includes applying to the article a series of cycles of alternating electrical plating and deplating pulses and directing the plating pulses in an electrolytic plating bath between the article and a first electrode and directing the deplating signals in the bath between the article and a second electrode. In accordance with a particular feature of the invention, a method of electrolytically plating metal patterns includes applying a series of alternating current-controlled plating pulses and voltage-controlled deplating pulses to the article.

Apparatus for electrolytically plating metal patterns in accordance with the invention includes a plating chamber having a provision for mounting an article, such as a semiconductor wafer. First and second electrodes positioned in the chamber are spaced from each other and from the article, and the necessary structure is provided for filling a space between the article and the first and second electrodes with a metal plating electrolyte. The apparatus further includes provisions for applying a series of cycles of electrolytic treating pulses which alternate between plating pulses between the article and the first electrode and deplating pulses between the article and the second electrode.

BRIEF DESCRIPTION OF THE DRAWING

The various features and advantages of the invention will be best understood when the following detailed description of an embodiment of the invention is read in reference to the appended drawing, wherein:

FIG. 3 is a schematic representation of an electrolytic plating apparatus, highlighting particular features of the present invention;

FIG. 5 is an electric signal diagram showing preferred alternating plating and deplating pulses as applied in accordance with the present invention; and FIG. 6 shows a portion of a semiconductor wafer and schematic current paths through the wafer.

DETAILED DESCRIPTION

Contact Plating Problems Relating To Diodes

Figure 1:
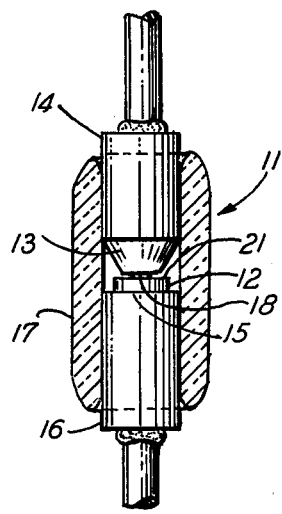
FIG. 1 shows a prior art diode as an example of efforts made to overcome problems existing with respect to such diodes.

FIG. 1 of the drawing shows a particular prior art diode component 11, a diode chip 12 of which is sandwiched between a tapered end 13 of a first lead stud 14 and a cylindrical end 15 of a second lead stud 16. The assemblage of the two studs 14 and 16 and the diode chip 12 is permanently held together and protected by a glass sleeve 17 which is heat-sealed about the ends 13 and 15 of the two studs. The tapered end 13 touches a metal button contact 18 of the diode chip 12. The remainder of the tapered end 13 of the stud 14 recedes from the diode surface areas 21 surrounding the contact 18. The receding shape of the tapered end 13 has been found to diminish the incidence of electrical shorts which tend to occur when metal whiskers occur in the diode area 21 surrounding the contact 18 and touch the stud 14. Such whiskers are defects and are typically not coupled to the diode junction in the diode chip 12.

The above-described diode component structure shows but one attempt to overcome problems encountered in the manufacture of glass-sealed diode components. It is, however, realized that the structure of the component 11 is comparatively costly to manufacture. The added cost stems from using two differently shaped studs and the requirement of a correct orientation of the button contact of the diode chip 12 toward the stud 14. Hence, a simplified diode component structure would be more desirable.

Figure 2:
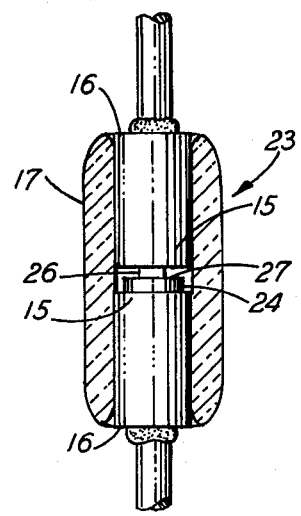
FIG. 2 shows a diode similar to the diode of FIG. 1, featuring, however, an improved contact as formed by the present invention.

FIG. 2 shows a diode component 23 which is similar in structure to the diode component 11. However, the diode component 23 features a preferred assemblage of two of the second lead studs 16. A diode chip 24 is sandwiched between the non-tapered, cylindrical ends 15 of the studs. The typical glass sleeve 17 again protects the diode chip 24 and permanently joins the lead studs 16 and the diode chip 24 into the diode component 23. In contrast to the diode chip 12, the diode chip 24 has a contact 26 which extends to a greater height above a diode surface 27 which surrounds the contact 26 than the contact 18 extends above its surrounding diode surface area 21. Consequently, the lead stud 16 adjacent to the contact 26 is spaced farther away from the diode surface 27 adjacent to the contact 26. To avoid problems of inadvertently shorting diodes, it is desirable to consistently plate such diode contacts 26 to a predetermined minimum height.

Apparatus Structure

FIG. 3 is a schematic representation of apparatus 31 for electroplating selected areas, such as a plurality of contact windows 32, on a surface 33 of an electric article, such as a semiconductor wafer 34. Electroplated metal deposited in such contact windows 32 is allowed to build up to a predetermined desired height above the surface 33 of the wafer 34 to form the contacts 26 described with respect to the diode chip 24.

The apparatus 31 shows a plating chamber 36. The wafer 34 is mounted to an underside 37 of a wafer holding lid 38. The wafer 34 may be held to the lid 38 by any suitable holding provision such as a preferred vacuum holding seat to which a vacuum is applied through suitable ducts 41.

The plating chamber 36 is preferably a cylindrical chamber having inside cross-sectional dimensions substantially equal to the size of the wafer 34 which is to be plated. A diffuser plate 43 divides the plating chamber 36 into a lower supply chamber 44 and into an upper electrode chamber 45 adjacent to the lid 38. The diffuser plate attaches at its periphery to a cylindrical, vertical wall 46 of the plating chamber 36. A pattern of apertures 48 through the diffuser plate 43 directs a highly agitated supply of plating electrolyte 49 toward the wafer 34 to impinge on the wafer 34 with distributed, surface layer reducing turbulence, as indicated by arrows 51.

The electrolyte 49 is discharged from the electrode chamber 45 through a peripheral gap 52 between an outer edge 53 of the wafer 34 and a knife edge shaped, top edge 54 of the cylindrical wall 46 of the plating chamber 36. Once discharged from the electrode chamber 45, the electrolyte is collected in a peripheral discharge chamber 56 and is returned (as indicated by various arrows 57) through a typical pumping system 58 to the supply chamber 44 of the plating chamber 36.

The diffuser plate 43 supports in the electrode chamber 45 a plating electrode 61 and a deplating electrode 62. The plating electrode 61 is preferably of circular shape and is centered on the cylindrical shape of the chamber 45. The diameter of the plating electrode 61 is less than the inside diameter of the electrode chamber 45, leaving an annular gap between the outer periphery of the plating electrode and an inside surface 64 of the wall 46. The deplating electrode 62 is of annular shape and is located concentrically about the plating electrode 61. The inner diameter of the deplating electrode 62 is sufficiently greater than the outer diameter of the plating electrode 61 such that an annular gap 66 exists between the two electrodes 61 and 62.

An electrolytic plating circuit shown schematically in FIG. 3 is designated generally by the numeral 71. A typical wafer contact 73 is mounted in the lid 38 and provides an electrical connection to a typically metallized back side 74 of the wafer 34. Through a typical conductive lead 76, the wafer contact 73 is coupled to a negative terminal 77 of a plating power source 78 identified in FIG. 3 as a plate rectifier. The lead 76 further couples the contact 73 to a positive terminal 81 of a deplating power source 82 identified in FIG. 3 as a strip rectifier.

A positive terminal 83 of the plating power source 78 and a negative terminal 84 of the deplating power source 82 are coupled respectively to first and second switched terminals 87 and 88 of a power switch 89. A signal generator 91 drives the switch 89 at a preferred frequency of 77 Hz. The switched portions of the signal cycles are unequally divided so that an established offset couples the plating power source 78 for eight milliseconds to a common terminal 92 of the switch, and thereafter couples the deplating power source 82 to the common terminal for the remainder of the cycle which amounts to substantially five milliseconds.

The common terminal 92 of the power switch 89 is coupled to two diode protected conductive leads 93 and 94 which complete the electrolytic circuits through the plating electrode 61 and the deplating electrode 62, respectively. A diode 96 in the conductive lead 93 to the plating electrode is coupled with its anode terminal toward the power switch 89 and with its cathode terminal toward the plating electrode. A diode 97 is coupled in the opposite direction into the conductive lead 94, such that its anode is coupled to toward the deplating electrode 62. Typical ammeters 98 are coupled into each of the leads 93 and 94 to monitor the average of the plating and deplating currents.

Figure 4:
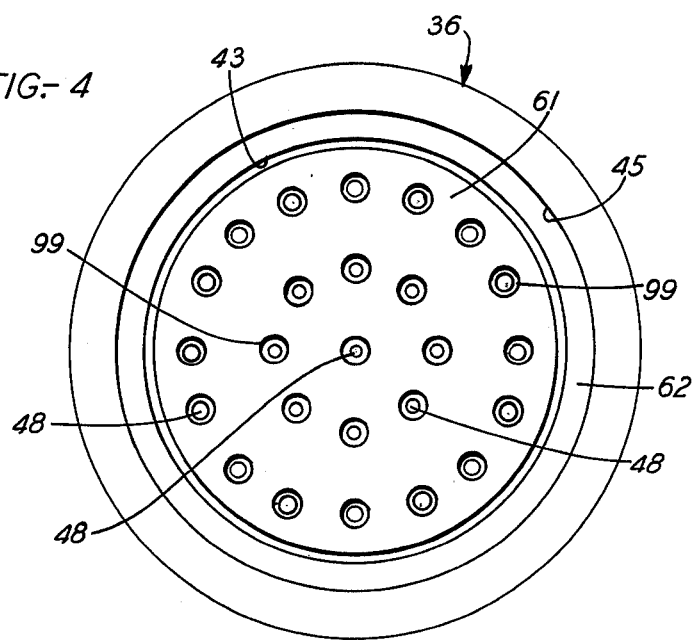
FIG. 4 is a top view into a plating chamber of the apparatus in FIG. 3.

FIG. 4 is a top view of the plating chamber 36 looking into the electrode chamber 45. The apertures 48 in the diffuser plate 43 are preferably arranged in two aperture circles centered about a single aperture 48 in the center of the diffuser plate. In the outer circle of apertures 48, there are twice as many apertures 48 as in the inner circle. In addition, the size of the outwardly located apertures is chosen to be larger than those closer to the center of the diffuser plate 43 so that the total cross-sectional area of the apertures increases radially outward approximately in proportion to the radial increase in the area of the wafer 34. The resulting flow pattern of the electrolyte 49 pumped through the apertures 48 is intended to impinge substantially uniformly on the surface of the wafer 34. All of the apertures 48 are located within a projected area of the plating electrode 61. Consequently, the plating electrode 61 has a plurality of apertures 99 which coincide with the apertures 48 in the diffuser plate 43. Preferably the apertures 99 are larger in size than the apertures 48 so that the plating electrode does not interfere with the upward directed streams of the electrolyte through the apertures 48.

Plating The Diode Contacts

In an embodiment of the invention, the apparatus 31 in FIG. 3 deposits metal, such as silver, to form the button contacts 26 of diodes in a three inch wafer 34 during a plating period of 70 seconds to a height of 1.8 mils (0.018 inch). In the described example, a commercially available silver plating electrolyte 49, known by the trade designation Engelhard S900 is recirculated at a preferred rate between 5 to 6 gallons per minute.

The electrolyte contains a silver concentration of 60 grams per liter and has a brightener addition of 2 to 3 parts per million of selenium. The pH is adjusted into a preferred range between 8.6 and 8.7. A commercially available Engelhard wetting agent is added in the amount of 2 cubic centimeters per liter of electrolyte.

The plating power source 78 is a commercially available power supply, such as one available, for example, from Hewlett-Packard. An open circuit voltage limit is adjusted to 10 volts, and the current supply is limited to a maximum of 8 amperes. The deplating power source 82 is also a commercially available power supply. In the described example, a power supply available from Schlumberger-Heathkit is used. The current limit of the deplating power source is set to its highest limit, and the voltage limitation of the power source is adjusted to a limit of 14 volts.

The signal generator 91 is one available from Hewlett-Packard. A first control of the signal generator 91 adjusts the number of cycles per second of the output signal. A second control allows an offset in each cycle to divide the alternating pulses unequally. The controls are adjusted to control the power switch 89 to switch the plating power source into the plating circuit for 8 milliseconds during each 13 second alternating cycle and to switch the deplating power source into the plating circuit for the remaining 5 milliseconds of each alternating cycle.

The power switch 89 is preferably a solid-state switch having the capability of switching a plating load of 8 amperes and a deplating current of lesser magnitude. Of course, various changes and modifications in the choice of the power sources 78 and 82 and the switched pulse generation are possible. It may be desirable, for example, to operate an integrated switched pulse power supply which supplies the plating and deplating pulses as described herein. FIG. 5 is a diagram of pulsed plating current signals in the positive (upward) direction and of the pulsed deplating signals in the downward direction. The pulsed plating current has a magnitude of 8 amperes and is applied for 8 milliseconds. The pulsed deplating signals of a duration of 5 milliseconds are voltage controlled at a magnitude of 14 volts.

The voltage-controlled deplating current of 5 milliseconds during each 13 millisecond cycle results in a deplating current of decreasing magnitude from an initial current value of between 100 to 400 milliamps to a substantially no current condition approximately half way through the preferred 70 second plating period. The constant reduction in the deplating current is believed to be the result of a passivation process such as an anodizing process in addition to an initial process of electrolytically removing initially present conductive deposits. FIG. 6 shows an enlarged portion of the wafer 34 mounted to the lid 38 which includes vacuum grooves 101 of a typical vacuum seat. FIG. 6 further shows schematically electrical resistive defect paths through the wafer 34, as well as the diode-protected contacts 26 through which the deplating current cannot flow. However, the deplating current does flow through metal deposits from undesirable defects 102 or from edge deposits 103 on the wafer to cause electrolytic removal of metal from such defects or deposits. Furthermore, silicon is believed to form an oxide under anodizing electrolytic current conditions, such that the initial conductive defects in a passivating layer 104 are converted to nonconductive compounds.

The alternating cycles of plating and deplating pulses while having the described advantages also present a particular problem which is overcome by the described apparatus 31. A plating apparatus functioning similarly to the described apparatus 31, but using only a single electrode functioning as plating and deplating electrode was found to require constant adjustments to increase the forward voltages to maintain consistency in the plated contacts 26. Also, the electrode of such apparatus, initially of preferred platinum, needed to be cleaned frequently after every few plating operations to avoid changing the settings of the power sources significantly.

It is theorized that the deplating current deposits in addition to the conductive silver deposits trace amounts of other, resistive elements or compounds on the otherwise conductive platinum electrode surface. Such other elements or compounds do normally not affect the surface resistance of the electrode to any significant extent, since they are jointly deposited with the silver during the deplating cycle. However, it is further believed that such highly resistive trace elements or compounds do not deplate as readily as the codeposited silver during the plating portions of the alternating cycles. Consequently, the silver is removed at the same rate at which it is deposited on the surface of the electrode, while the highly resistive materials continue to build to continuously change the surface resistance of the electrode and, consequently, the internal resistance of the plating circuit. To maintain constant current conditions in such a plating arrangement, the current needs to be continuously monitored and constant adjustments need to be made at the power source. Such unstable conditions are deemed undesirable.

In the described apparatus 31 of FIG. 3, both the plating electrode 61 and the deplating electrode 62 are preferably of platinum or have at least a platinum surface. The plating electrode 61 is protected from reverse current pulses by the diode 96 to prevent material deposition on the plating electrode during the periods of applied deplating currents. The electrode 61 of the apparatus 31, consequently, remains clean during any number of successive wafer plating operations. Silver and other platable materials are deposited, however, on the annular deplating electrode 62. But since the deplating electrode 62 is isolated from the plating circuit by the diode 97 during the plating pulse of the cycle, the conductive silver remains on the deplating electrode 62 together with such other trace elements, so that the surface resistance of the deplating electrode also remains substantially unchanged over successive plating operations.

Eventually, the deplating electrode 62 needs to be replaced because of buildups of the plated metal, such as the described silver. However, because the deplating current is driven by the voltage controlled deplating power source 82, the metal deposits on the electrode 62 are held to a necessary minimum. The established 14 volt bias across the electrolyte 49 does not result in any fixed value of the deplating current. The amount of deplating current depends on the number of defects on the wafer 34. Consequently, variations in the magnitude of the initial deplating current have been observed which ranged between 100 and 400 milliamps. Typically, after about 35 seconds of the established 70 second plating period, the deplating current has substantially subsided, and substantially no further deposits appear on the deplating electrode.

As may be realized from the above description, the various described elements cooperatively interact in a plating operation wherein certain plating parameters once established tend to yield consistent results. The described constant current pulses result in a substantially constant growth rate of the contacts 26 in that as the surface area of the plated contacts 26 increases, the resistance of the defect regions also increases resulting in an increased availability of plating current to plate the contact. Toward the end of the established plating period, the surface area, percentagewise, undergoes little change. Consequently, the plating current being substantially fully applied to plate the contacts does not have to be increased further.

There are, of course, many changes and modifications possible within the spirit and scope of the described invention. It is clearly understood that the plating process as described does not only apply to the described button contacts of the diodes in the wafer 34 but applies to various other metallization patterns of various metals which may be coupled through protective diodes to a plating circuit. For example, gold contacts in semiconductor transistor processing are platable in some instances in a similar manner. It should be understood that the representative plating currents are substantially proportional to the areas being plated and that any change in the size of the wafer 34 should bring about an appropriate change in the amount of plating current required.

The plating speed may be affected by the amount of agitation of the electrolyte 49 adjacent to the surface of the wafer 34. Consequently, a change in the size of the wafer 34 may require a reasonable amount of experimentation in establishing hole patterns in relationship to the changed size of the wafer to yield metal deposition rates near the edges of the wafer which are substantially equal to those near the center of the wafer. Also, the flow rate or pumped rate of the electrolyte may be adjusted to values other than those preferred values set forth herein. These and various other changes and modifications are possible within the spirit and scope of the invention.

What is claimed is:

1. A method of electrolytically plating metal patterns to patterned anode surface windows of diode-coupled conductive regions beneath a passivating surface layer of an electrical article, which comprises:
    coupling the article into an electrolytic treating circuit;
    exposing the patterned windows to an electrolytic plating bath;
    applying a series of alternating electrical plating and deplating pulses to the article; and
    directing the plating pulses applied to the article through the electrolytic plating bath and a first electrode, and directing the deplating pulses through the electrolytic plating bath and a second electrode.

2. A method of electrolytically plating metal patterns according to claim 1, wherein applying a series of alternating electrical plating and deplating pulses comprises alternating between electrical current pulses of a preestablished current magnitude having an electron flow from the article through the electrolytic plating bath to the first electrode and electrical voltage pulses placing the article at a more positive electrical potential than the second electrode.

3. A method of electrolytically plating metal patterns according to claim 2, wherein applying a series of alternating electrical plating and deplating pulses comprises applying the electrical current pulses for a duration between 7 and 9 milliseconds and applying the electrical voltage pulses during periods following the electrical current pulses for a duration between 4 and 7 milliseconds.

4. A method of electrolytically plating metal patterns according to claim 2, comprising regulating the voltage of the electrical voltage pulses applied between the article and the second electrode.

5. A method of electrolytically plating metal patterns according to claim 4, wherein applying a series of alternating electrical plating and deplating pulses comprises applying a series of alternating plating pulses of a first duration and deplating pulses of a second duration shorter than the first duration.

6. A method of electrolytically plating metal patterns according to claim 5, wherein the article is a semiconductor wafer which is substantially covered with a passivating layer on one major surface thereof and wherein the patterned windows are contact windows formed through such passivating layer of the wafer above anode regions of rectifying junctions formed in the semiconductor wafer, and wherein exposing the patterned windows to an electrolytic plating bath comprises exposing the passivating layer including the windows therethrough to an electrolytic silver plating bath, and continuing applying the series of alternating plating pulses and deplating pulses until the metal patterns in the contact windows have formed to a height of at least 1.5 mils above the surface of the passivating layer.

7. A method of electrolytically plating metal patterns according to claim 6, comprising agitating the electrolytic silver plating bath by directing a plurality of streams of the bath within the bath in a substantially distributed pattern toward the wafer to impinge against the wafer.

8. A method of electrolytically plating metal patterns according to claim 7, wherein agitating the electrolytic silver plating bath comprises pumping the electrolytic silver plating bath from an excess supply of such bath under pressure into a supply chamber and directing the bath from such supply chamber through a pattern of apertures corresponding to said substantially distributed pattern through an electrode chamber toward the surface of the wafer, and discharging an excess of such electrolytic silver plating bath from such electrode chamber through an annular passage adjacent to the periphery of the wafer.

9. Apparatus for electrolytically depositing metal on a surface of an article, comprising:
  first and second electrically independent electrodes;
  means for supporting said article in relationship opposite to and spaced from said first and second electrodes;
  means for filling a space between said article and said first and second electrodes with a metal plating electrolyte; and
  means for applying electrolytic plating pulses between said article and said first electrode and for applying electrolytic deplating pulses between said article and said second electrode.

10. Apparatus for electrolytically depositing metal on a surface of an article according to claim 9, wherein the applying means comprises:
  means for alternating said plating pulses and said deplating pulses;
  means for controlling the magnitude of the current of the plating pulses; and
  means for controlling the magnitude of the voltage of the deplating pulses.

11. Apparatus for electrolytically depositing metal on a surface of an article according to claim 9 which comprises means for agitating said metal plating electrolyte in the space between said article and said first and second electrodes.

12. Apparatus for electrolytically depositing metal on a surface of an article according to claim 11, where the article is a semiconductor wafer having a surface coated with a passivating layer and having patterned windows opened through such passivating layer, such windows opening anode surface contacts of diode regions in such semiconductor wafer, such surface contacts being the surface on which metal is to be deposited, wherein means for supporting said article comprises a plating chamber having a diffuser plate carrying said first and second electrodes and having a lid including means for mounting said wafer on an inside surface of said lid opposite to and spaced from said first and second electrodes.

13. Apparatus for electrolytically depositing metal according to claim 12, wherein the wafer is circular in shape and the plating chamber has a wall of circular cross section of substantially the same size as the wafer and means for filling a space between said wafer and said first and second electrodes comprises a discharge chamber, and a pumping system coupled between said discharge chamber and said plating chamber for pumping the electrolyte from said discharge chamber and into said plating chamber, said lid being spaced from said wall forming an annular opening about the periphery of the wafer for discharging an excess of such electrolyte from said plating chamber into said discharge chamber.

14. Apparatus for electrolytically depositing metal on a surface according to claim 13, wherein the diffuser plate divides the plating chamber into a lower supply chamber and into an upper electrode chamber, said pumping system being coupled to said supply chamber of the plating chamber, said means for agitating said metal plating electrolyte comprising a plurality of apertures extending in a pattern through the diffuser plate, said apertures extending in a direction toward the wafer such that the electrolyte pumped into the supply chamber is directed through the electrolyte occupying the electrode chamber to impinge upon the surface of the wafer, thereby agitating the electrolyte in the electrode chamber.

15. Apparatus for electrolytically depositing metal on a surface according to claim 14, wherein said first electrode is of circular shape, said first electrode mounted to the diffuser plate above said pattern of apertures, said first electrode having a plurality of openings positioned coincident with the apertures in the diffuser plate, said openings being larger than the apertures, and wherein the second electrode is of annular shape, said second electrode having an inner diameter larger than the outer diameter of the first electrode, said second electrode being mounted concentrically about the periphery of the first electrode.

16. Apparatus for electrolytically depositing metal according to claim 15, wherein said means for applying electrolytic plating pulses between said wafer and said first electrode and electrolytic deplating pulses between said wafer and said second electrode comprises:
  means for alternating said electrolytic plating pulses and said electrolytic deplating pulses; and
  means for controlling the current of said electrolytic plating pulses and for controlling the voltage of said electrolytic deplating pulses.

* * * * *